(12) United States Patent
Henson et al.

(10) Patent No.: US 7,157,356 B2
(45) Date of Patent: Jan. 2, 2007

(54) METHOD FOR FORMING A NOTCHED GATE INSULATOR FOR ADVANCED MIS SEMICONDUCTOR DEVICES AND DEVICES THUS OBTAINED

(75) Inventors: Kirklen Henson, Gastonia, NC (US); Radu Catalin Surdeanu, Heverlee (BE)

(73) Assignees: Interuniversitair Microelektronica Centrum (IMEC), Leuven (BE); Koninklijke Philips Electronics N.V., Eindhoven (NL)

( * ) Notice: Subject to any disclaimer, the term of this patent is extended or adjusted under 35 U.S.C. 154(b) by 22 days.

(21) Appl. No.: 10/966,152

(22) Filed: Oct. 15, 2004

(65) Prior Publication Data

US 2005/0127436 A1    Jun. 16, 2005

(30) Foreign Application Priority Data

Oct. 17, 2003   (EP) ................................ 03447260

(51) Int. Cl.
*H01L 21/04* (2006.01)
(52) U.S. Cl. ...................... 438/511; 438/305
(58) Field of Classification Search ............... 438/511, 438/305
See application file for complete search history.

(56) References Cited

U.S. PATENT DOCUMENTS

| | | | |
|---|---|---|---|
| 5,223,445 A | 6/1993 | Fuse | |
| 5,434,093 A * | 7/1995 | Chau et al. | 438/300 |
| 5,516,707 A * | 5/1996 | Loh et al. | 438/302 |
| 5,554,544 A * | 9/1996 | Hsu | 438/302 |
| 6,284,630 B1 | 9/2001 | Yu | |
| 2001/0028086 A1 | 10/2001 | Makabe et al. | |
| 2002/0163039 A1 | 11/2002 | Clevenger et al. | |

FOREIGN PATENT DOCUMENTS

| | | |
|---|---|---|
| EP | 1 089 344 A2 | 4/2001 |
| JP | 11-003990 | 1/1999 |
| JP | 11-163323 | 6/1999 |

* cited by examiner

*Primary Examiner*—N. Drew Richards
(74) *Attorney, Agent, or Firm*—Knobbe Martens Olson & Bear LLP

(57) ABSTRACT

Methods of providing a semiconductor device with a control electrode structure having a controlled overlap between control electrode and first and second main electrode extensions without many spacers are disclosed. A preferred method provides a step of etching back an insulating layer performed after amorphizing and implanting the main electrode extensions. Preferably, the step that amorphizes the extensions also partly amorphizes the insulating layer. Because etch rates of amorphous insulator and crystalline insulator differ, the amorphized portion of the insulating layer may serve as a natural etch stop to enable even better fine-tuning of the overlap. Corresponding semiconductor devices are also provided.

11 Claims, 3 Drawing Sheets

METHOD FOR FORMING A NOTCHED GATE INSULATOR FOR ADVANCED MIS SEMICONDUCTOR DEVICES AND DEVICES THUS OBTAINED

TECHNICAL FIELD OF THE INVENTION

The present invention relates to a method for forming a notched gate insulator semiconductor device and the device thus obtained. More particularly, the present invention relates to a method for the formation of a semiconductor device structure comprising first and second main electrode extensions, e.g. source and drain extensions, with controllable control electrode, e.g. gate electrode, overlap.

BACKGROUND OF THE INVENTION

The scaling of Metal-Oxide-Semiconductor (MOS) or Metal-Insulator-Semiconductor (MIS) transistor devices has reached a point where the length of the gate electrode is only a few tens of nanometers. Requirements for the source/drain extensions (the ultra-shallow junctions USJ) are mainly three-fold, i.e. very high activation (for end-of-the-roadmap devices above the solid solubility limit), ultra-shallow (towards less than 10 nm) and a very high lateral abruptness (1–2 nm/decade). The last one is also dictated by another requirement, the gate leakage level at the junction's overlap with the gate region. There is a trade-off between having no overlap for minimal gate leakage and enough overlap for optimal gate action on the junction. This trade-off is one of the major problems in scaling down the planar devices.

In U.S. Pat. No. 6,274,446 a method is described for the fabrication of a semiconductor device comprising abrupt source/drain extensions with controllable gate electrode overlap. The method comprises the steps of forming a gate structure on a semiconductor substrate, followed by forming an oxide layer on the gate and substrate. First, sidewall spacer regions are formed on the sides of the gate structure. Deep source/drain regions that do not overlap with the gate electrode are implanted in the semiconductor substrate. In order to create overlap, second spacer regions of silicon are formed on the sides of the sidewall spacer regions. Upper regions of the gate structure and the sidewall spacer regions are silicided in order to electrically connect them. Also portions of source/drain extension regions in the semiconductor substrate adjacent the gate structure are silicided.

A first disadvantage of the method described in the above document is the number of extra steps required, i.e. "extending" the gate electrode by means of depositing silicon side wall spacers, etching back the spacers and connecting the spacers to the body of the original gate electrode.

Another disadvantage of the above method is that by the inevitable presence of an oxide layer between the body of the gate electrode and the silicon sidewall spacers, the overall gate electrode is in fact a discontinuous body of material with deleterious effects on the properties thereof.

In EP 1 089 344 an insulated gate field effect transistor and a method of making the same are described. The device comprises a first gate insulating film, such as $TiO_2$, which is formed on a channel region. A gate electrode is formed on the first gate insulating film. Source and drain regions are formed in a surface portion of a p-well region. The gate electrode is formed such that it may partially overlap the source/drain region. The $TiO_2$ film is subjected to either isotropic or anisotropic etching so that a portion of the $TiO_2$ film which lies on the source/drain region, may be removed, hereby forming a recess underneath the gate electrode.

In JP 11 163323 a semiconductor device comprising an insulating layer, a gate electrode and a source and drain is described. By adjusting the etching time of an etching process of the insulating layer, the overlap length between the gate electrode and the source and drain can be adjusted. Etching of the insulating layer is performed by wet chemical etching in a 0.3% HF solution.

A disadvantage of EP 1 089 344 and JP 11 163323 is that the etching process of the insulating layer can not be controlled very well. Nowadays, scaling down of electric and electronic devices plays a very important role in semiconductor processing. With the methods described in EP 1 089 344 and JP 11 163323 it will be difficult to form, in a controllable way, shallow recesses in devices having small dimensions.

SUMMARY OF THE INVENTION

Certain aspects of the present invention provide a simple method of providing controlled overlap between first and second main electrode extensions, e.g. source and drain extensions, and the main electrode, e.g. gate electrode, of a semiconductor device structure.

One aspect of the invention provides a semiconductor device structure comprising an insulating layer provided on a semiconductor substrate, a control electrode, e.g. a gate, provided on the insulating layer, and a first main electrode extension, e.g. source extension, and a second main electrode extension, e.g. drain extension, in the substrate. The electrodes have an overlap with the control electrode. The insulating layer comprises a recess near the first main electrode extension and near the second main electrode extension with respect to the control electrode. The recess has a depth of between about 0.5 and 5 nm. An advantage of the recess near first and second main electrode extension is that the overlap between the control electrode and the first and second main electrode extensions can easily be controlled by means of changing the depth of the recess during the processing of the device. The depth of the recess may be less than a width of an overlap between the control electrode and the first main electrode extension and/or the second main electrode extension.

The semiconductor device structure according to the present invention may have a control electrode with a length of less than about 100 nm, preferably about 50 nm or less.

Furthermore, the semiconductor device structure of the present invention may preferably have an overlap between the insulating layer and the first and second main electrode extensions of between about 10 and 20% of the length of the control electrode. The overlap between the control electrode and the first and second main electrode extensions may preferably be between 10 and 20% of the length of the control electrode.

In the device of the present invention the insulating layer may be made of a material comprising silicon oxide. The control electrode may be made of material comprising silicon. The control electrode may comprise polycrystalline material, e.g. polysilicon.

An aspect of invention provides a method for processing a semiconductor device structure comprising providing an insulating layer and a control electrode, e.g. gate, onto a substrate, amorphizing a region to be implanted in the substrate to form first and second main electrode extensions, and amorphizing part of the insulating layer by means of accelerated ions under a first angle with respect to a direction perpendicular to the substrate, implanting a first main electrode extension, e.g. source extension, and a second main electrode extension, e.g. drain extension, under a second angle with respect to a direction perpendicular to the substrate, etching back part of the insulating layer in order to reduce capacitive overlap between the control electrode and the first and second main electrode extensions to a reduced but non-zero overlap level, hereby forming recesses. The border between the amorphized part and the non-amorphized part of the control electrode insulating layer acts as an etch stop. Hence, by changing the magnitude of the part of the insulating layer that is amorphized, the depth of the recesses may be changed. Etching back may be performed by a dip in a HF solution with a concentration between about 0.1 and 10%.

In an embodiment of the present invention, the first angle, under which amorphizing of the first and second electrode extension regions and of part of the insulating layer occur, and the second angle, under which implantation of first and second main electrode extensions occur, may substantially be the same. In another embodiment, the angles may be different. In either of the above embodiments, the first and the second angle may vary between about 0° and 45° with respect to a direction perpendicular to the plane of the substrate.

The method may furthermore comprise activating the first and second main electrode extensions. In an embodiment of the present invention, activation of the first and second main electrode extensions may be performed by an annealing step selected from the group consisting of rapid thermal annealing, flash rapid thermal annealing, solid phase epitaxy regrowth or laser thermal annealing. In a preferred embodiment, the activation step is performed after the step of etching back, because annealing may remove the amorphized parts of the gate insulating layer. This results in reduced control over the overlap between the control electrode and the first and second main electrode recesses because the border of the amorphized parts of the gate layer and the non-amorphized parts of the gate insulator layer acts as an etch stop.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figure 1:
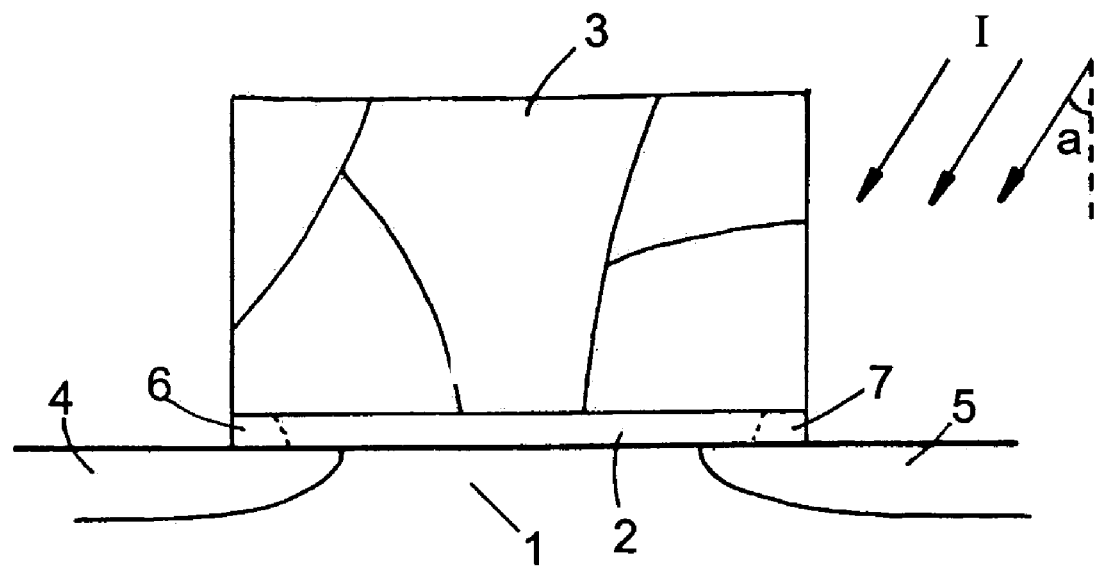
FIG. 1 is schematic cross-sectional view of a MOSFET device during an extension implant.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The method according to the invention may be used in many methods for fabricating semiconductor devices with insulated control electrodes, for example gates. In the description hereinafter, a method is described for manufacturing a device having a gate as control electrode and a source and a drain as first and second main electrodes.

The method may comprise the following steps. On top of a semiconductor substrate 1, a gate insulating layer 2 is formed by means of any suitable deposition technique, The deposition method is selected based upon the material of the insulating layer 2. Exemplary materials include thermally grown oxides, which may optionally be post-treated to form a nitrided silicon oxide. As another example, chemical vapor deposition techniques (CVD) may be used to form high-k dielectrics such as $HfO_2$. The substrate 1 may be any kind of semiconductor material such as for example pure silicon, germanium, gallium arsenide or others. The substrate 1 may furthermore be a doped semiconductor, such as for example n-type silicon or p-type silicon, or a combination thereof. The gate insulating layer 2 may be any suitable type of insulator material, such as for example silicon dioxide.

Figure 3A:
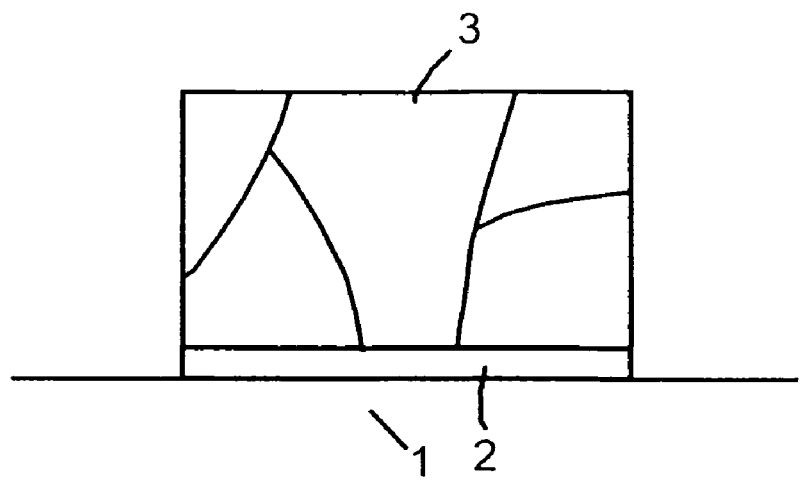
FIGS. 3A–3E are schematic cross-section illustrating a method of forming a semiconductor device In the different figures, the same reference figures refer to the same or analogous elements.

In a next step a gate electrode 3 is formed. Therefore a conductive layer which may for example be a semiconductor layer such as e.g. Si, a metal layer such as e.g. gold, aluminum or copper, or an inorganic conductive layer such as an indium tin oxide (ITO) layer may be deposited on top of the gate insulating layer 2 by means of any suitable deposition technique such as for example vapor deposition, sputter deposition or spin coating. Subsequently, the deposited layer may be etched back to the form of an electrode. Therefore a mask is applied onto that part of the conductive layer, which will later form the gate electrode 3. The mask may be made of any suitable material, such as for example a polymer, which may be deposited onto the conductive layer by means of for example spin coating. The conductive layer is then etched, removing the part of the conductive layer which is not covered by the mask. The same masking step may also be used to etch the part of the gate insulating layer 2 which is not under the formed gate electrode 3. FIG. 3A illustrates a semiconductor device at this stage of the formation process. Therefore, an etching solution, which may etch both the conductive material of the gate electrode 3 and the insulating material of the gate insulating layer 2, is preferably used. In FIG. 1, the gate electrode 3 is shown as being (poly)crystalline but the invention is not restricted hereto.

Next, a source extension 4 and a drain extension 5 are implanted. Modern source and drain junctions have to fulfill extreme requirements, such as for example very high activation, i.e. above the solid solubility limit, ultra shallow junctions (less than 10 nm depth) and a very high lateral abruptness of about 1–2 nm/decade. Moreover, the gate leakage level at the overlap of the source or drain junctions and the gate electrode 3 must be at a controlled level, in order to find a balance between minimal gate leakage and enough overlap for optimal gate action on the junction. Although it may be advantageous, in some instances, to have zero overlap and hence minimal gate leakage, a too low overlap may cause a too small overlap between the electric fields of source, gate and drain, and hence a too slow gate action, or for example a too slow transistor.

Figure 3B:
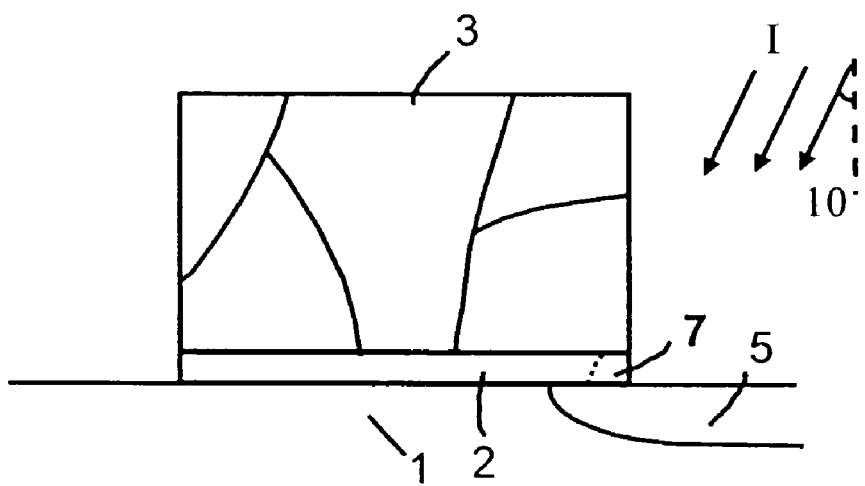
Figure 3C:
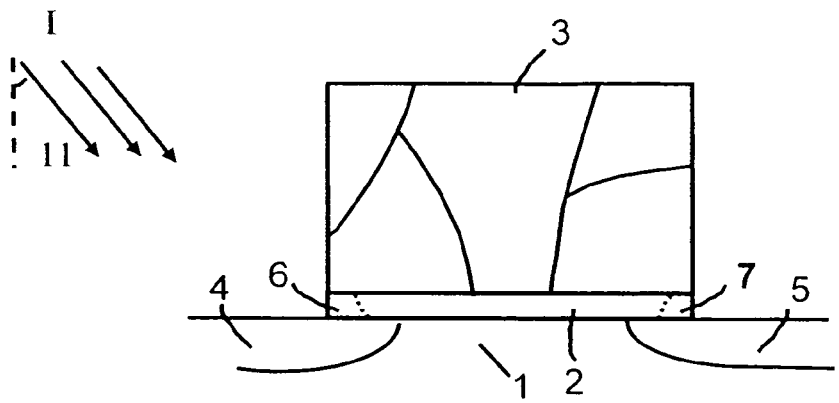

In order to fulfill the above mentioned requirements, an additional step of amorphizing the region to be implanted is performed, according to the present invention, before the actual implanting of source and drain regions is performed. This step may also be referred to as pre-amorphization implant (PAI). PAI is a well controllable method which limits the depth to which implants can be made. Thereto, atoms, or more precisely ions, are implanted in a sufficient concentration to disrupt the originally perfect crystal lattice of the substrate 1, so that it becomes amorphous. Applying PAI will thus form regions of a shape like source extension and drain extensions 4, 5 in FIG. 1. The step of amorphizing the extension volume by bombarding under a suitable first angle ensures that a part of the accelerated ions used in the bombarding will pass through the part of the gate electrode 3 nearest the semiconductor substrate 1, and will hence form an amorphized volume 6, 7 showing overlap with the gate electrode 3. FIG.3A illustrates amorphizing a first region of the substrate and a first region of the insulating layer by accelerating ions under an angle 10 with respect to a direction substantially perpendicular to the substrate, forming, in the illustrated example, amorphized volume 7 and an amorphized region which will form drain electrode 5. FIG. 3B illustrates amornhizina a second region of the substrate and a second region of the insulating layer by accelerating ions under an angle 11 with respect to the direction substantially perpendicular to the substrate, forming, in the illustrated embodiment, amorphized volume 6 and an amorphized region which will form source extension 4. In a PAI, atoms that in principle do not themselves influence the dopant concentration level, such as for example Si or Ge, are implanted in the region of the extensions 4, 5. For Ge, for example, this may occur at energies of approximately 8 to 20 keV, with concentrations between about $5.1e14$ to $3.1e15$ atoms/cm$^3$ and under an angle of between for example 0° and 45°. To obtain a desired amorphization different conditions may be required for different kinds of semiconductors.

Figure 3D:
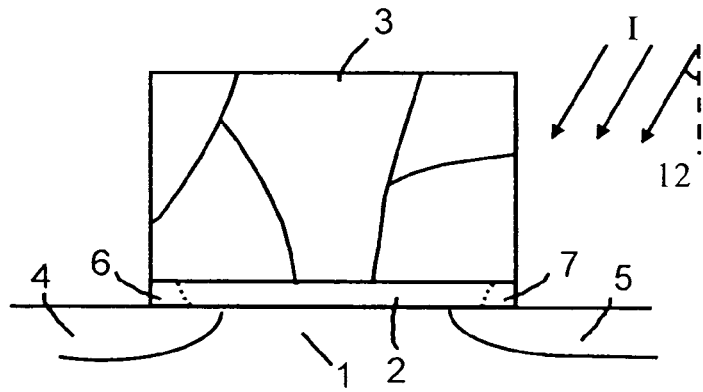

After PAI, the step of actual implanting the extension regions 4, 5 with the desired dopants may be performed. For example, boron atoms may be implanted at energies of about 0.5 keV with concentrations up to approximately $1.10e15$ atoms/cm$^3$. However, any kind of suitable implant energy, dose or dopant type may be used in this step. The step of implanting may be performed under a second angle, which, in some cases, may be substantially the same as the first angle. FIG. 3D illustrates implanting ions into the amorphized regions of the substrate to form a source extension 4 and a drain extension 5 by implanting ions using an angle 12 with respect to the direction substantial perpendicular to the substrate. It may thus be ensured that with the appropriate energy of the dopants, the dopants may be present in the amorphized region.

The direction of bombarding in order to amorphize and the direction for implanting may be chosen towards the gate electrode 3 in order to achieve overlap. This means that in principle two different directions are required for treatment of the source side and the drain side of the device. However, this does not entail additional masking steps, because the implants for source and drain differ anyhow, and the amorphizing step before the implanting step does not need any additional masking step. For example, the drain extension 5 may be implanted according to a direction indicated by arrows I in FIG. 1, including an angle a with a direction perpendicular to the substrate 1. In FIG. 1 this direction is indicated by the dashed line.

The angles and energies of the accelerated ions for amorphizing and for implanting of the dopants may be selected such that a desired overlap is realized. Selection of these quantities is interrelated and further depends on the type of semiconductor substrate 1 used.

During the PAI step, not only the semiconductor substrate 1 is amorphized. Also a part of the gate insulating layer 2 may, to a depth of for example a few nanometers, be amorphized due to the action of the amorphizing particles. In FIG. 1 this is shown as amorphous parts 6 and 7. This damage may be undone by annealing the semiconductor device during a further activation step, so that all of the gate insulating layer would be (poly)crystalline again. However, the damage caused in the gate insulating layer 2 by PAI may be further used during processing to achieve controllable overlap between extensions 4, 5 and the gate electrode 3 (see further).

After having performed the above steps, a structure like the one shown in FIG. 1 is the result. In a next step, a part of the gate insulating layer 2 is removed in order to reduce the capacitive overlap between gate electrode 3 and extensions 4, 5 to a reduced but non-zero overlap level. This may be done by means of etching, e.g. by means of a wet etch. The material of the gate insulating layer 2, i.e. a dielectric material in general, on the one hand, and the material of the gate electrode 3 and the semiconductor substrate 1 on the other hand are different. Therefore, an etchant may be selected which selectively etches the gate insulating layer 2 but not the other materials used. Furthermore, in one embodiment, the gate insulating layer 2 comprises amorphized parts 6, 7 and a non-amorphized or polycrystalline part. Because the etch rate of the amorphous gate insulator may differ from that of the (poly)crystalline gate insulator deeper under the gate 3, and in most cases may be higher, the border between the amorphous and polycrystalline gate insulator may be used as an etch stop. Hence, an etching solution may be required which only removes the amorphized parts 6, 7 of the gate insulating layer 2 and does not etch the polycrystalline part of the insulating layer 2.

For example, the etching step may be performed by dipping the semiconductor device structure in a HF solution, preferably with a concentration between about 0.1 and 10%, for example 0.2%, during a period between for example 1 second and 5 minutes. The type of etchant, concentration of the etching solution and etching time may depend on the depth required to etch or on the material that has to be etched. Therefore, this step of etching back the gate insulating layer 2 offers a good control over the overlap, for it is possible to select a relatively slow and therefore precise etching process. Alternatively, the gate insulating layer 2 may also be etched before the actual implant of the extensions 4, 5.

Figure 2:
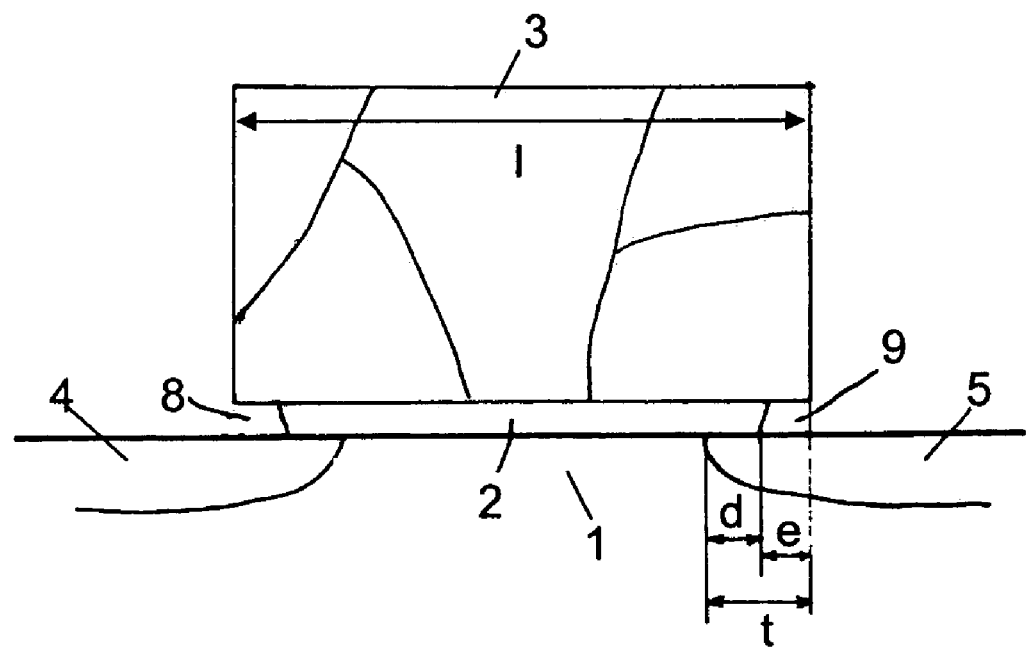
FIG. 2 is a schematic cross-sectional view of the device of FIG. 1 after etching the control electrode, e.g. gate, insulating layer.
Figure 3E:
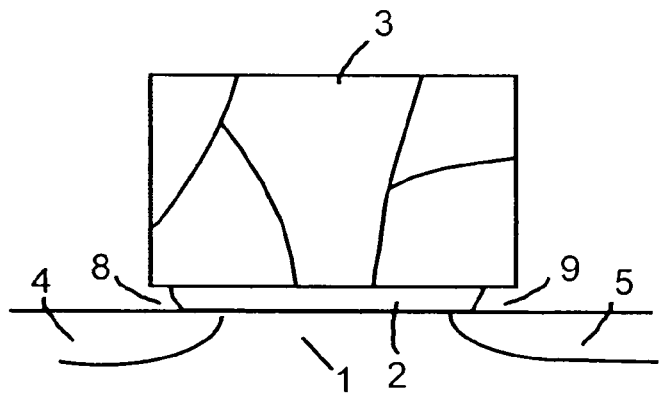

After performing the etching step, a structure as shown in FIG. 2 and FIG. 3E may result. The structure differs from that in FIG. 1 only in that the amorphized parts 6 and 7 have been etched away and have become recesses 8 and 9. The term "recess" is intended to mean an abrupt change in the corresponding dimension, in this case in the direction between source 4 and drain 5. In principle the recesses 8, 9 are mirror images of each other. However, by making use of additional masking steps and different etching conditions, it may be possible to make source and drain recesses 8, 9 with different depths.

In FIG. 2, the recess 9 on the right hand side of the device is shown as having an etch depth e. The etch depth may for example be a few nanometers, preferably between 0.5 and 5 nm. The distance d represents the remaining overlap between drain extension 5 and gate insulating layer 2. The remaining overlap d between the gate insulating layer 2 and the drain extension 5 may preferably be between about 10 and 20%, for example 15%, of the length 1 of the gate electrode 3. The latter statement only applies for gate lengths below about 100 nm, preferably 50 nm or less. For larger gate lengths, a smaller overlap ratio may be selected.

A following step may be an activation step in order to activate the implanted dopants, i.e. to build the dopants into the crystal lattice of the semiconductor substrate 1. This step may also be referred to as a junction anneal step. The junction anneal step may be performed by annealing the device with for example high ramp rates. Preferred processes include rapid thermal anneal (RTA), flash rapid thermal anneal (fRTA), solid phase epitaxy (SPE) and laser thermal anneal (LTA). The type of anneal and the energy concerned may be selected according to the requirements of a specific device. In the present invention, it is preferred to perform this annealing step after etching the gate insulating layer thus forming the recesses 8, 9, because annealing may remove the "etch stop", which was formed by PAI, by curing the gate insulating layer 2. Because of that, the control over the overlap between the gate electrode 3 and the source and drain recesses 8, 9 may disappear.

After thus forming a junction with controlled overlap and activating it, the processing of the semiconductor device structure may be finished with any desired subsequent step, depending on the kind of semiconductor device that has to be formed. For example, in a CMOS process, a spacer for deep source and drain implants may be deposited in for example a low temperature plasma enhanced chemical vacuum deposition (CVD) process in the form of an oxide, at a deposition temperature of for example 400° C. The CVD oxide will not fill the recesses 8, 9 due to its course-grained porosity. Furthermore, any other desired subsequent step in the process of forming the semiconductor device may be performed.

In general, a balance has to be found between an overlap which is as small as possible to reduce parasitic capacitance and hot carrier effect, and an overlap which is big enough to ensure a quick response of the semiconductor device, i.e. a short switching time. The total overlap between source and drain extensions 4, 5 and the gate electrode 3 is represented by t in FIG. 2. With short gate lengths of less than about 100 nm it may be sufficient when the extensions 4, 5 overlap the gate electrode 3 for between about 10% and 20%, e.g. 15%, of the length of the gate electrode 3. Therefore, this method is particularly suitable for forming an overlapping extension 4, 5 for devices with very short gate lengths, because it gives the possibility to obtain a sufficient overlap without having to use diffusion techniques. Diffusion techniques suffer from less abrupt transitions between extensions 4, 5 and substrate 1 and are furthermore more difficult to control. In particular, it is very difficult to limit diffusion to an overlap of less than 10 nm. For very short gate lengths of for example 50 nm down to even 30 or 20 nm, this is a too large overlap and hence the diffusion technique is then no longer useful.

An advantage of aspects of the present invention is the simple way of tuning the overlap between the gate electrode 3 and source and drain extensions 4, 5, without the need for masks and/or spacers. This may reduce production time and hence production costs. Furthermore, the method of the present invention leads to strongly reduced gate leakage in the semiconductor device thus obtained.

It is to be understood that although preferred embodiments, specific constructions and configurations, as well as materials, have been discussed herein for devices according to the present invention, various changes or modifications in form and detail may be made without departing from the scope and spirit of this invention.

What is claimed is:

1. A method of forming a semiconductor device structure comprising:
  forming an insulating layer and a control electrode on a substrate;
  amorphizing a first region of the substrate and a first region of the insulating layer, wherein amorphizing the first regions comprises accelerating ions under a first angle with respect to a direction substantially perpendicular to the substrate;
  amorphizing a second region of the substrate and a second region of the insulating layer, wherein amorphizing the second regions comprises accelerating ions under a second angle with respect to the direction substantially perpendicular to the substrate;
  implanting ions into the amorphized regions of the substrate to form a source extension and a drain extension, wherein implanting ions comprises implanting ions using a third angle with respect to the direction substantially perpendicular to the substrate;
  etching back the two amorphized regions of the insulating layer to form recesses that reduce capacitive overlap between the control electrode and first and second main electrode extensions.

2. The method of claim 1, further comprising activating dopants in the source and drain extensions.

3. The method of claim 2, wherein activating dopants in the source and drain extensions comprises performing an annealing step selected from the group consisting of rapid thermal annealing, flash rapid thermal annealing, solid phase epitaxy regrowth and laser thermal annealing.

4. The method of claim 2, wherein activating dopants in the source and drain extensions is performed after etching back the insulating layer.

5. The method of claim 1, wherein the first angle and the second angle are substantially the same.

6. The method of claim 5, wherein the first angle, the second angle, and the third angle are substantially the same.

7. The method of claim 1, wherein the first angle, the second angle, and the third angle are between about 0° and 45° with respect to the direction substantially perpendicular to the substrate.

8. The method of claim 1, wherein etching back the insulating layer comprises performing a wet etch with a hydrofluoric acid solution with a hydrofluoric acid concentration of between about 0.1% and 10%.

9. A method of controlling control electrode overlap in a semiconductor device, comprising
  forming a main electrode in a substrate;
  forming an insulating layer and a control electrode over the substrate;
  amorphizing a connection region in the substrate between the main electrode and the control electrode and a sacrificial region in the insulating layer;
  implanting dopants in the connection region after amorphizing the connecting layer;
  activating the dopants in the connection region to form an electrode extension; and removing the sacrificial region in the insulating layer after activating the dopants to form a recess between the electrode extension and the control electrode.

10. The method of claim 9, wherein activating the dopants comprises performing an annealing step.

11. The method of claim 9, wherein activating the dopants in the connection region comprises performing an annealing process.

* * * * *

UNITED STATES PATENT AND TRADEMARK OFFICE
CERTIFICATE OF CORRECTION

PATENT NO. : 7,157,356 B2    Page 1 of 1
APPLICATION NO. : 10/966152
DATED : January 2, 2007
INVENTOR(S) : Henson et al.

It is certified that error appears in the above-identified patent and that said Letters Patent is hereby corrected as shown below:

In column 3, line 56, after "device" insert -- , --.

In column 3, line 64, after "Moreover" insert -- , --.

In column 5, line 30, delete "amornhizina" and insert -- amorphizing --, therefor.

In column 8, line 61, in Claim 9, delete "connection" and insert -- sacrificial --, therefor.

In column 8, line 61, in Claim 9, after "the" insert -- insulating layer and a connection region in the --.

In column 9, line 1, in Claim 9, before "sacrificial" insert -- amorphized --.

Signed and Sealed this

Thirteenth Day of July, 2010

David J. Kappos
*Director of the United States Patent and Trademark Office*